United States Patent
Worley

(10) Patent No.: US 8,531,805 B2
(45) Date of Patent: Sep. 10, 2013

(54) GATED DIODE HAVING AT LEAST ONE LIGHTLY-DOPED DRAIN (LDD) IMPLANT BLOCKED AND CIRCUITS AND METHODS EMPLOYING SAME

(75) Inventor: Eugene R. Worley, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 295 days.

(21) Appl. No.: 12/403,418

(22) Filed: Mar. 13, 2009

(65) Prior Publication Data

US 2010/0232077 A1   Sep. 16, 2010

(51) Int. Cl.
*H02H 9/00* (2006.01)
*H01C 7/12* (2006.01)
*H01L 23/62* (2006.01)

(52) U.S. Cl.
USPC ............................. 361/56; 361/119; 257/355

(58) Field of Classification Search
USPC ..................... 361/56, 119; 257/355
See application file for complete search history.

(56) References Cited

U.S. PATENT DOCUMENTS

| | | | |
|---|---|---|---|
| 5,159,518 A | 10/1992 | Roy | |
| 5,629,544 A | 5/1997 | Voldman et al. | |
| 6,589,823 B1 * | 7/2003 | Beebe et al. | 438/151 |
| 7,532,446 B2 * | 5/2009 | Cheng et al. | 361/56 |
| 2004/0080883 A1 | 4/2004 | Chatterjee et al. | |
| 2004/0105203 A1 * | 6/2004 | Ker et al. | 361/56 |
| 2004/0240127 A1 * | 12/2004 | Juliano et al. | 361/56 |
| 2005/0035409 A1 * | 2/2005 | Ko et al. | 257/350 |
| 2005/0035410 A1 * | 2/2005 | Yeo et al. | 257/355 |
| 2005/0057866 A1 * | 3/2005 | Mergens et al. | 361/56 |
| 2005/0266846 A1 | 12/2005 | Kim et al. | |
| 2006/0128087 A1 | 6/2006 | Bamji et al. | |
| 2007/0029646 A1 * | 2/2007 | Voldman | 257/662 |

(Continued)

FOREIGN PATENT DOCUMENTS

| | | |
|---|---|---|
| FR | 2903833 A1 | 1/2008 |
| RU | 2287228 C2 | 11/2006 |

(Continued)

OTHER PUBLICATIONS

Thijs, S. et al., "Design methodology of FinFET devices that meet IC-Level HBM ESD targets," Electrical Overstress/Electrostatic Discharge Symposium, 2008. EOS/ESD 2008. 30th , vol., No., pp. 294-302, Sep. 7-11, 2008.*

(Continued)

*Primary Examiner* — Scott Bauer
(74) *Attorney, Agent, or Firm* — Sam Talpalatsky; Nicholas J. Pauley; Joseph Agusta

(57) ABSTRACT

Gated diodes, manufacturing methods, and related circuits are provided wherein at least one lightly-doped drain (LDD) implant is blocked in the gated diode to reduce its capacitance. In this manner, the gated diode may be used in circuits and other applications whose performance is sensitive to load capacitance while still obtaining the performance characteristics of a gated diode. These characteristics include fast turn-on times and high conductance, making the gated diodes disclosed herein well-suited for electro-static discharge (ESD) protection circuits as one application example. The examples of the gated diode disclosed herein include a semiconductor substrate having a well region and insulating layer thereupon. A gate electrode is formed over the insulating layer. Anode and cathode regions are provided in the well region, wherein a P-N junction is formed. At least one LDD implant is blocked in the gated diode to reduce capacitance.

34 Claims, 9 Drawing Sheets

(56) References Cited

U.S. PATENT DOCUMENTS

| | | | |
|---|---|---|---|
| 2007/0229154 A1* | 10/2007 | Kim et al. ............... | 330/149 |
| 2008/0056390 A1 | 3/2008 | Rainbolt et al. | |
| 2008/0246086 A1 | 10/2008 | Korec et al. | |
| 2008/0285513 A1 | 11/2008 | Jung et al. | |
| 2009/0170269 A1* | 7/2009 | Dutta ..................... | 438/289 |
| 2009/0180433 A1 | 7/2009 | Ahn et al. | |
| 2010/0032749 A1 | 2/2010 | Shrivastava et al. | |
| 2010/0034303 A1 | 2/2010 | Damnjanovic et al. | |
| 2010/0102390 A1* | 4/2010 | Vashchenko et al. ...... | 257/355 |
| 2012/0074496 A1 | 3/2012 | Jalilizeinali et al. | |

FOREIGN PATENT DOCUMENTS

| | | |
|---|---|---|
| WO | 03069806 A1 | 8/2003 |
| WO | 2006105005 A2 | 10/2006 |
| WO | 2006118418 A2 | 11/2006 |
| WO | WO2006125149 | 11/2006 |
| WO | 2007052922 A1 | 5/2007 |
| WO | WO2008043078 A2 | 4/2008 |
| WO | WO2010105178 A2 | 9/2010 |
| WO | WO2010115137 A1 | 10/2010 |

OTHER PUBLICATIONS

Ericsson et al: "Text Proposal for DC-HSDPA assumptions and standards impact" 3GPP Draft; R1-082249 Text Proposal for DC-HSDPA Assumptions and Standards Impact, 3rd Generation Partnership Project (3GPP), Mobile Competence Centre; 650, Route Des Lucioles; F-06921 Sophia-Antipolis Cedex; France, vol. RAN WG1, No. Kansas City, USA; May 23, 2008, XP050110541, p. 8, paragraph 4.1-paragraph 4.2; p. 9, paragraph 4.3.1.

International Search Report and Written Opinion—PCT/US2010/027172, International Search Authority—European Patent Office—Sep. 30, 2010.

Qualcomm Europe: "Multicarrier Control for LTE-Advanced" 3GPP Draft; R1-090862, 3rd Generation Partnership Project (3GPP), Mobile Competence Centre; 650, Route Des Lucioles; F-06921 Sophia-Antipolis Cedex ; France, No. Athens, Greece; Feb. 3, 2009, XP050318712.

International Search Report—PCT/US2010/027172, International Search Authority—European Patent Office Sep. 30, 2010.

Written Opinion—PCT/US2010/027172, International Search Authority—European Patent Office Sep. 30, 2010.

Ericsson, "Carrier aggregation in LTE-Advanced", 3GPP Draft, R1-082468, 3rd Generation Partnership Project (3GPP), Mobile Competence Centre, 650, Route Des Lucioles, F-06921 Sophia-Antipolis Cedex, France, vol. RAN WGI, No. Warsaw, Poland, Jun. 30, 2008, XP050110739.

ZTE,"Technical scope for LTE-advanced evolution",3GPP TSG-RAN WG1#53b R1-082380,Jun. 30, 2008.

Worley et al., "CDM effect on a 65 nm SOC LNA", 32nd Electrical Overstress/Electrostatic Discharge Symposium (EOS/ESD), Oct. 3, 2010, pp. 1-8, IEEE, XP031791670, ISBN: 978-1-58537-182-2.

Yang et al., "BSIM4-based lateral diode model for LNA co-designed with ESD protection circuit", 11th International Symposium on Quality Electronic Design (ISQED), Mar. 22, 2010, pp. 87-91, IEEE, XP031660196, ISBN: 978-1-4244-6454-8, DOI: 10.1109/ISQED.2010.5450396.

\* cited by examiner

GATED DIODE HAVING AT LEAST ONE LIGHTLY-DOPED DRAIN (LDD) IMPLANT BLOCKED AND CIRCUITS AND METHODS EMPLOYING SAME

BACKGROUND

I. Field of the Disclosure

The technology of the present application relates to gated diodes and their use in circuits and related methods, including protection circuits, electro-static discharge (ESD) protection circuits, and high speed or switching circuits.

II. Background

Electro-static discharge (ESD) is a major reliability issue in integrated circuits (ICs). ESD is a transient surge in voltage (negative or positive) that may induce a large current in a circuit. To protect circuits against damage from ESD surges, protection schemes attempt to provide a discharge path for both positive and negative ESD surges. Conventional diodes can be employed in ESD protection circuits to clamp the voltage of positive and negative ESD surges to shunt current and prevent excessive voltage from being applied to a protected circuit. FIG. 1 illustrates a conventional ESD protection circuit in this regard. As illustrated in FIG. 1, a voltage rail ($V_{dd}$) 10 and a ground rail (GND) 12 are provided to power a protected circuit 14. The protected circuit 14 can be any type of circuit and provided in any form desired. In this example, a terminal in the form of a signal pin 16 provides a signal path to the protected circuit 14 for providing information and/or control to the protected circuit 14. For example, the protected circuit 14 may be included in an IC, with the signal pin 16 being an externally available pin on the IC chip.

A conventional ESD protection circuit 18 may be coupled between the voltage rail 10 and ground rail 12 to protect the protected circuit 14 from ESD surges. The exemplary ESD protection circuit 18 in FIG. 1 includes two conventional diodes: a positive ESD surge diode 20 and a negative ESD surge diode 22. The positive ESD surge diode 20 and the negative ESD surge diode 22 are coupled in series. The positive ESD surge diode 20 clamps positive voltage on the signal pin 16 to one diode drop above the voltage rail 10. The negative ESD surge diode 22 clamps negative voltage on the signal pin 16 to one diode drop below the ground rail 12. A cathode (k) of the positive ESD surge diode 20 is coupled to the voltage rail 10. An anode (a) of the positive ESD diode 20 is coupled to the signal pin 16 at a node 24 on the signal path between the signal pin 16 and the protected circuit 14. A cathode (k) of the negative ESD surge diode 22 is also coupled to the node 24 on the signal path from the signal pin 16 to the protected circuit 14. An anode (a) of the negative ESD surge diode 22 is coupled to the ground rail 12.

For positive ESD surges on the signal pin 16, the positive ESD surge diode 20 will become forward biased and clamp voltage on the signal pin 16 to one diode drop above the voltage rail 10 to protect the protected circuit 14. Energy from such an ESD surge will be conducted through the positive ESD surge diode 20 in a forward biased mode and dispersed into the voltage rail 10. Appropriate ESD protection structures may be implemented (not shown) in the voltage rail 10 to eventually dissipate a positive ESD surge to the ground rail 12. For negative ESD surges on the signal pin 16, the surge is similarly dissipated. A negative ESD surge on the signal pin 16 will place the negative ESD surge diode 22 in a forward biased mode thus providing a low-impedance path relative to the protected circuit 14. Energy from the negative ESD surge will be dissipated into the ground rail 12.

Because circuits are increasingly being provided in system-on-a-chip (SOC) configurations due to higher transistor counts, providing ESD protection in SOC technologies is becoming increasingly important. SOC technologies may employ field effect transistors (FETs) that provide a relatively thin oxide gate dielectric. These relatively thin dielectrics are susceptible to destructive breakdown and damage by excessive voltages from an ESD surge event. Further, conventional diodes, such as the ESD surge diodes 20, 22 provided in FIG. 1, may not provide sufficient conduction for ESD protection in SOC technology.

To address these shortcomings in ESD protection, and for SOC technologies in particular, shallow trench isolation (STI) diodes have been provided in ESD protection circuits. Gated diodes are also being employed in ESD protection circuits. It has been shown that use of a gated diode has superior conductance per unit length as well as turn-on speed due to the transient path of its carriers. Turn-on speed of an ESD protection circuit is important for meeting charge device modeling (CDM) specifications where large amounts of current (e.g., several amps) can flow in a very small fraction of time (e.g., less than a nanosecond) during ESD events. However, even with these advantages of gated diodes, STI diodes are predominantly used in ESD protection circuits for high speed circuits. Gated diodes can unacceptably decrease performance. A gated diode has greater perimeter capacitance per unit diffusion or active length than an STI diode. This is illustrated by example in the modeling graph 26 of FIG. 2, where input capacitance (C) of a gated diode pair 28 and an STI diode pair 30 corresponding to FIG. 1 is plotted versus input voltage (V). This example assumes a 65 nanometer (nm) process. As shown, the input capacitance (C) of the gated diode pair 28, which is normalized to the maximum capacitance of the STI diode pair 30, is higher than the input capacitance (C) of the STI diode pair 30 for given voltage (V), length, and width of the diodes (approximately 8.0 and 0.45 micrometers (μm), respectively). For example, at the rail voltage ($V_{dd}$), the normalized capacitance (C) of the gated diode pair 28 is nearly 1.8 whereas the normalized capacitance (C) of the STI diode pair 30 is approximately 1.0. This equates to the gated diode pair 28 having an approximately eighty percent (80%) increase in capacitance over the STI diode pair 30 in this example.

Increased perimeter capacitance in a gated diode increases the load capacitance when the gated diode is added to a protected circuit. Increasing load capacitance can negatively affect protected circuits. For example, increased load capacitance can decrease switching times and frequency performance of a protected circuit, because charging time will be increased due to the ESD protection circuit being coupled to the protected circuit in an R-C circuit arrangement. Further, increased capacitance provided as a result of inserting an ESD protection circuit can decrease the sensitivity of radio frequency (RF) components, such as a low noise amplifier (LNA). However, use of an STI diode having a lower capacitance in an ESD protection circuit also has a trade off over a gated diode. Use of an STI diode in an ESD protection circuit can result in low CDM voltage tolerances for the protected circuit for both positive and negative surges, and especially for protected circuits and related processes employing thin oxide gate oxide dielectric devices coupled to a pad that can be found in large SOC chips.

To preserve performance, chip manufacturers and customers have had to accept the lower CDM voltage tolerances provided by use of STI diodes in ESD protection circuits, which results in greater ESD-related exposure and failures. Thus, a need exists to provide an ESD protection circuit that exhibits superior conductance and turn-on time as well as a low capacitance so as to not adversely affect performance of a protected circuit.

SUMMARY OF THE DISCLOSURE

Embodiments disclosed in the detailed description include examples of gated diodes, exemplary methods of manufacture of the same, and related circuits and methods. The gated diode examples all have at least one lightly-doped drain (LDD) implant blocked to reduce capacitance of the gated diode. In this manner, the gated diode may be employed in circuits and other circuit applications whose performance may be sensitive to load capacitance, but also desire or require the performance characteristics of a gated diode. Benefits of a gated diode include, but are not limited to, fast turn-on times and high conductance.

In embodiments disclosed herein, the gated diode includes a semiconductor substrate having a well region. The well region includes a semiconducting material having an impurity. Impurities include either a P-doped or N-doped impurity. An insulating layer is provided on the well region. A gate electrode is formed over the insulating layer. An anode region and a cathode region are implanted in the well region on opposite sides of the gate electrode. Depending on the gated diode design, the anode region or cathode region has an impurity of opposite polarity from a well region to form a P-N junction. In one example, for a diode contained within an N-well region, the anode region has an impurity of opposite polarity impurity from the N-well region to form a P-N junction between the anode and well region. In another example, for a diode contained within a P-well region, the cathode region has an impurity of opposite polarity impurity from the P-well region to form a P-N junction between the cathode and well region. The well regions have at least one LDD implant blocked between either the anode region, the cathode region, or both the anode and cathode regions.

The gated diode having at least one blocked LDD implant can be included in any circuit, integrated circuit, or circuit application. One example includes an electro-static discharge (ESD) protection circuit. An ESD protection circuit is enhanced by fast turn-on times and high conductance characteristics of the gated diode. However, if the ESD protection circuit employs one or more of the gated diodes having at least one LDD implant blocked, the capacitance of the ESD protection circuit is reduced as well. This may allow the ESD protection circuit to be employed to protect circuits whose performance is sensitive to load capacitance while still achieving the ESD characteristics of gated diodes. Otherwise, use of gated diodes in the ESD protection circuit may not be possible without affecting the protected circuit's performance in an unacceptable manner. Other examples of protected circuits whose performance may be sensitive to load capacitance and thus may benefit from the gated diodes disclosed herein include high speed differential input/output circuits and radio frequency (RF) circuits, including but not limited to low noise amplifiers (LNAs).

DETAILED DESCRIPTION

Figure 1:
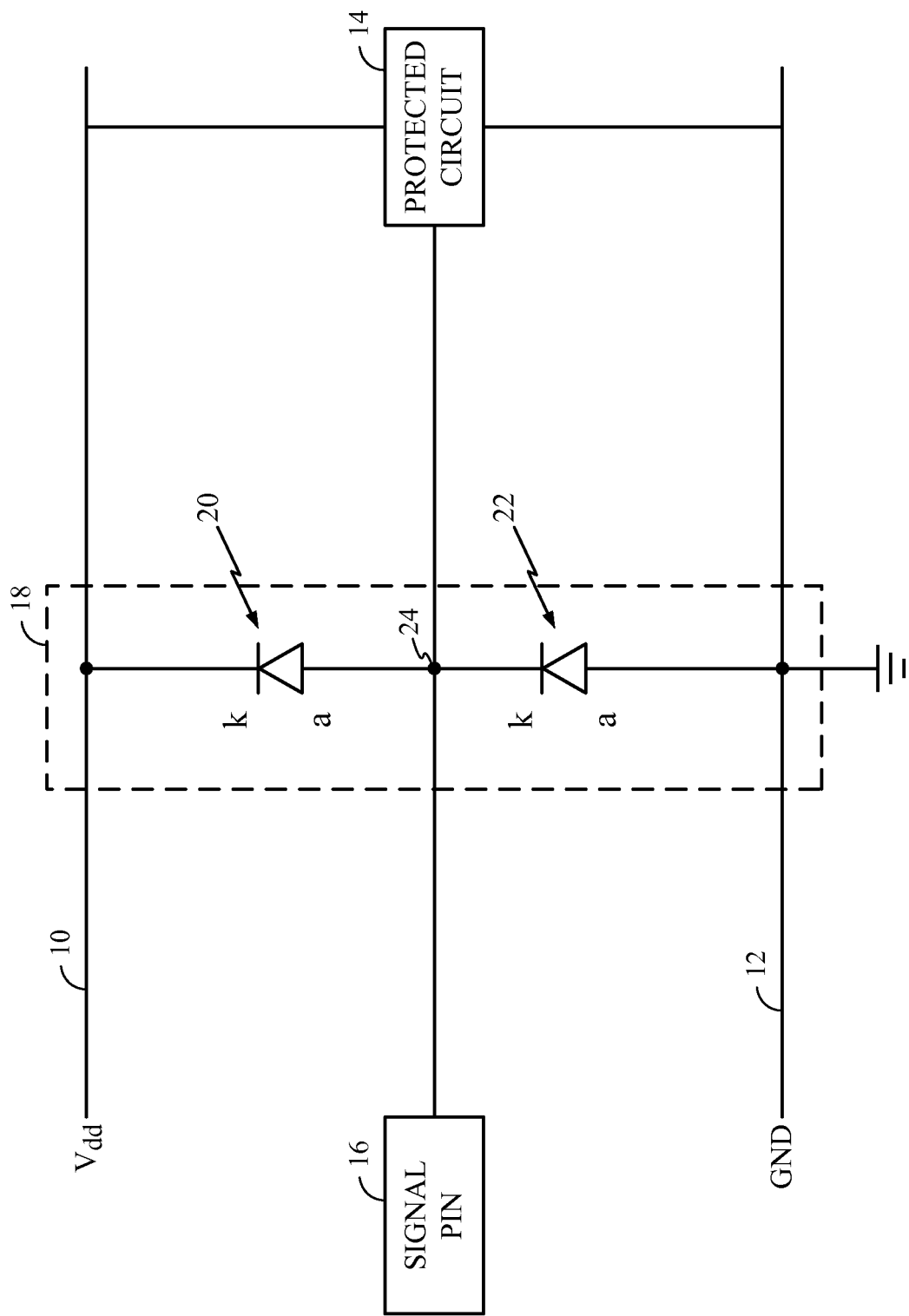
FIG. 1 is an example of a conventional electro-static discharge (ESD) protection circuit in the prior art.
Figure 2:
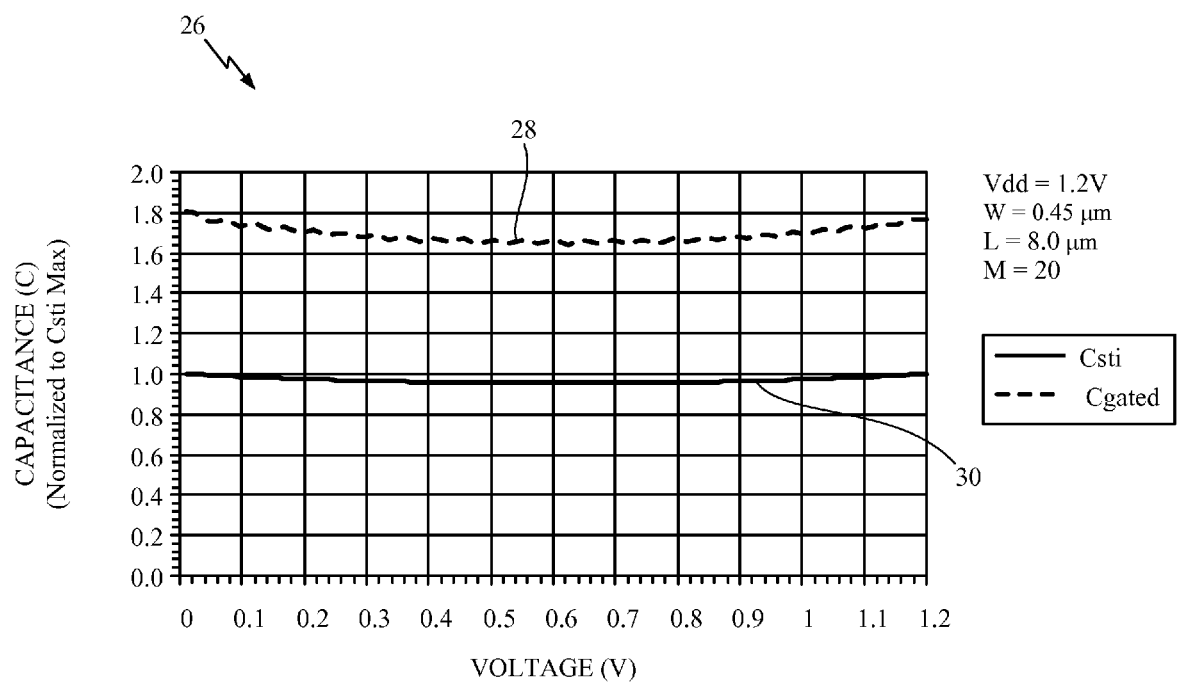
FIG. 2 is a graph of an exemplary comparison of input capacitance between a pair of input diodes rendered as gated diodes and as shallow trench isolation (STI) diodes.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include examples of gated diodes, exemplary methods of manufacture of the same, and related circuits and methods. The gated diode examples all have at least one lightly-doped drain (LDD) implant blocked to reduce capacitance of the gated diode. In this manner, the gated diode may be employed in circuits and other circuit applications whose performance may be sensitive to load capacitance, but also desire or require the performance characteristics of a gated diode. Benefits of a gated diode include, but are not limited to, fast turn-on times and high conductance.

In embodiments disclosed herein, the gated diode includes a semiconductor substrate having a well region. The well region includes a semiconducting material having an impurity. Impurities include either a P-doped or N-doped impurity. An insulating layer is provided on the well region. A gate electrode is formed over the insulating layer. An anode region and a cathode region are implanted in the well region on opposite sides of the gate electrode. Depending on the gated diode design, the anode region or cathode region has an impurity of opposite polarity from a well region to form a P-N junction. In one example, for a diode contained within an N-well region, the anode region has an impurity of opposite polarity impurity from the N-well region to form a P-N junction between the anode and well region. In another example, for a diode contained within a P-well region, the cathode region has an impurity of opposite polarity impurity from the P-well region to form a P-N junction between the cathode and well region. The well regions have at least one LDD implant blocked between either the anode region, the cathode region, or both the anode and cathode regions.

Figure 3:
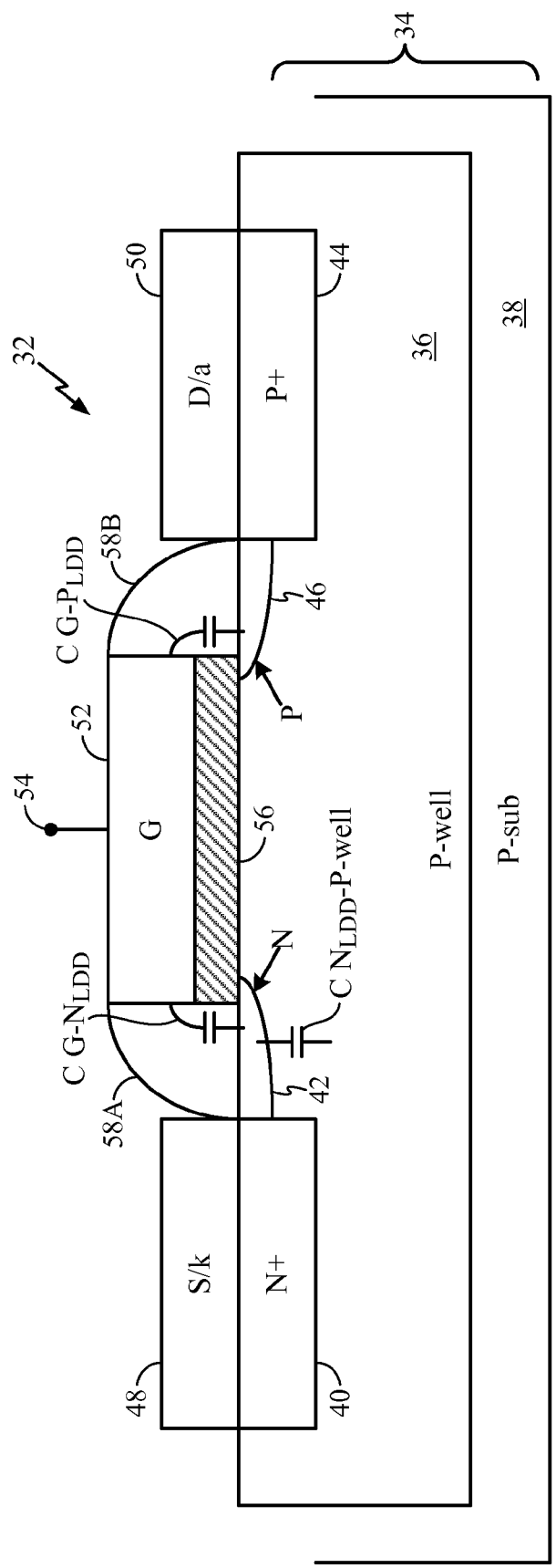
FIG. 3 is an exemplary gated diode including lightly-doped drain (LDD) implants.

Before discussing particular examples of gated diodes having one or more blocked lightly-doped drain (LDDs) implants, an example of a gated diode having LDD implants is first explained. FIG. 3 illustrates a gated diode 32 having LDD implants. The gated diode 32 is based on a metal oxide semiconductor (MOS) design, which is also used for MOS field effect transistors (MOSFETs). The gated diode 32 demonstrates superior forward bias conductance (e.g., 100 mS/μm of stripe length) as well fast turn-on times, (e.g., on the order of one-hundred (100) picoseconds or less). As illustrated, the gated diode 32 includes a base semiconductor substrate 34 for depositing of other materials to form the gated diode 32. The semiconductor substrate 34 may be formed from a Silicon (Si) wafer, because Silicon wafers are relatively inexpensive. Alternatively, the semiconductor substrate 34 may be formed from any other semiconducting material desired. The semiconductor substrate 34 illustrated is an N-type gated diode having a P-well semiconducting material 36 forming a channel in a P-type substrate 38. However, the semiconductor substrate 34 could also be a P-type gated diode having an N-well semiconducting material formed in a P-type substrate having voltages and operations complimentary to an N-type gated diode. Other variants can include the diode structure of FIG. 3 surrounded by a deep N-well that is implanted into the P-type substrate 38.

Several semiconducting sub-regions are provided in the P-well semiconducting material 36 that are tailored to form the active device region of the gated diode 32. The sub-regions comprise an N+ doped region 40, an N-type LDD implant 42, a P+ doped region 44, and a P-type LDD implant 46. The N+ doped region 40 form an anode region, and the P+ doped region 44 forms a cathode region. These symbols indicate the type and amount of relative impurities introduced into the P-well semiconducting material 36. The N+ doped region 40 may be coupled to an electrical conductor to provide a cathode (k), or a source (S) node terminal 48 for the gated diode 32. The P+ doped region 44 may also be coupled to an electrical conductor to provide an anode (a), or a drain (D) node terminal 50 for the gated diode 32. The gated diode 32 also includes a gate electrode (G) 52 that is isolated from the P-well semiconducting material 36, the cathode terminal 48, and the anode terminal 50 by an insulating layer 56. The insulating layer 56 is often referred to as an oxide layer, although other insulating materials are possible. The insulating layer 56 may be of any thickness desired, but typically is very thin and may have a thickness between approximately 12 Angstroms (Å) and 80 Å as an example. The gate electrode 52 may be formed from a conventional conducting material, but is provided in the form of polycrystalline silicon ("Polysilicon") in this example, as is well known.

Spacer regions 58A, 58B are also provided on each side of a gate terminal 54 as a result of a leftover residual insulating material placed over the gated diode 32 that were subsequently etched. The spacer regions 58A, 58B allow the N-type and P-type implants 40, 44 to be formed in the P-well semiconducting material 36 after spacer formation. The N-type and P-type LDD implants 42, 46 are formed before spacer deposition. In MOSFETs, LDD implants are included to increase operating voltage and long term reliability of MOSFETs. Specifically, the LDD implants reduce the electro-static cross section of the drain so that electrostatic coupling between the drain and source is small. Otherwise, an electro-static drain to source coupling field will cause increase off state or leakage current though drain induced barrier lowering (DIBL) when the MOSFET's gate to source potential is in the off state. Since MOSFETs can be bi-directional and because of process constraints, the LDD is applied to both sides of the MOSFET gate. Thus, by providing N-type and P-type LDD implants 42, 46 in a MOSFET, a much smaller electro-static cross section is present so that an electric field at either the source or drain terminal is spread out and is not as intense so as to provide the MOSFET with a low leakage current. Also, the field reduction at the drain through application of the LDD implant improves hot electron reliability. These N-type and P-type LDD implants 42, 46 are included in the gated diode 32 since the gated diode 32 is based on a MOSFET design and mask.

Figure 4:
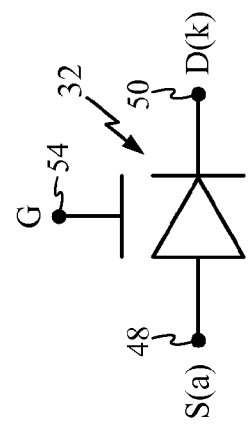
FIG. 4 is an exemplary schematic symbol to represent the gated diode of FIG. 3.

Thus in summary, the gated diode 32 is a three-terminal device as illustrated in FIG. 4. The three terminals are the cathode terminal 48, the anode terminal 50, and the gate terminal 54. A P-N junction exists between the P-well semiconducting material 36 and the N+ doped region 40. Current can flow with relative ease from the anode terminal 50 to the cathode terminal 48 coupled to the N+ doped region 40 when a positive voltage difference is present between the anode terminal 50 and the cathode terminal 48. The gate terminal 54 is attached to the terminal whose diffusion region polarity is the same well region polarity. In the case of FIG. 3, the gate terminal 54 would be coupled to the anode terminal 50 since the anode terminal 50 is coupled to the P+ doped region 44 which is of the same polarity as the P-well semiconducting material 36. The coupling arrangement is made to minimize capacitive loading on the cathode terminal 48 which, for this polarity diode, can be coupled to the input/output (I/O) pad while the anode is coupled to a second voltage rail or ground. The gate has no electrical purpose in the operation of the diode as a protection element and is used as a fabrication vehicle to separate the N+ doped region 40 and P+ doped region 44 without an intervening STI region.

The gated diode 32 has several sources of parasitic capacitances that all add together to generate a total capacitance for the gated diode 32. As noted earlier, for the diode polarity of FIG. 3, the node coupled to the I/O is the cathode terminal 48 which should have as little capacitance as possible with respect to the power supply coupled to the anode terminal 50. For the common configuration, the gate terminal 54 is tied to the anode terminal 50. For the cathode terminal 48 which couples to a signal pad, a first parasitic capacitance is present due to the perimeter capacitance caused by the gate electrode 52 (hereinafter "gate capacitance") overlapping the N-type LDD implant 42. The insulating layer 56 between these materials acts as a dielectric to form the parallel plate capacitance. For example, a parasitic capacitance component is provided across the insulating layer 56 between the gate electrode 52 and the N-type LDD implant 42 overlapping the insulating layer 56 labeled "C G-$N_{LDD}$" in FIG. 3. A parasitic capacitance can also be similarly formed between the gate electrode 52 and the P-type LDD implant 46 overlapping the insulating layer 56 labeled "C G-$P_{LDD}$". Capacitance increases inversely proportional to the width of the insulating layer 56. The cathode of the gated diode 32 has a larger parasitic capacitance than a STI diode, because the STI diode has no gate electrode. Higher perimeter capacitance equates to a higher overall capacitance which can adversely impact the performance of a protected circuit when the gated diode 32 is employed in an ESD protection circuit.

Another parasitic capacitance is formed between the sidewall of the N-type LDD implant 42 between the P-well semiconducting material 36 labeled "C $N_{LDD}$-P-well". A higher concentration in doping of the P-well semiconducting material 36 between the insulating layer 56 and the N-type LDD implant 42 also contributes to an increase in this parasitic capacitance. These factors all contribute to an overall increase in parasitic capacitance of the cathode of the gated diode 32.

Figure 5:
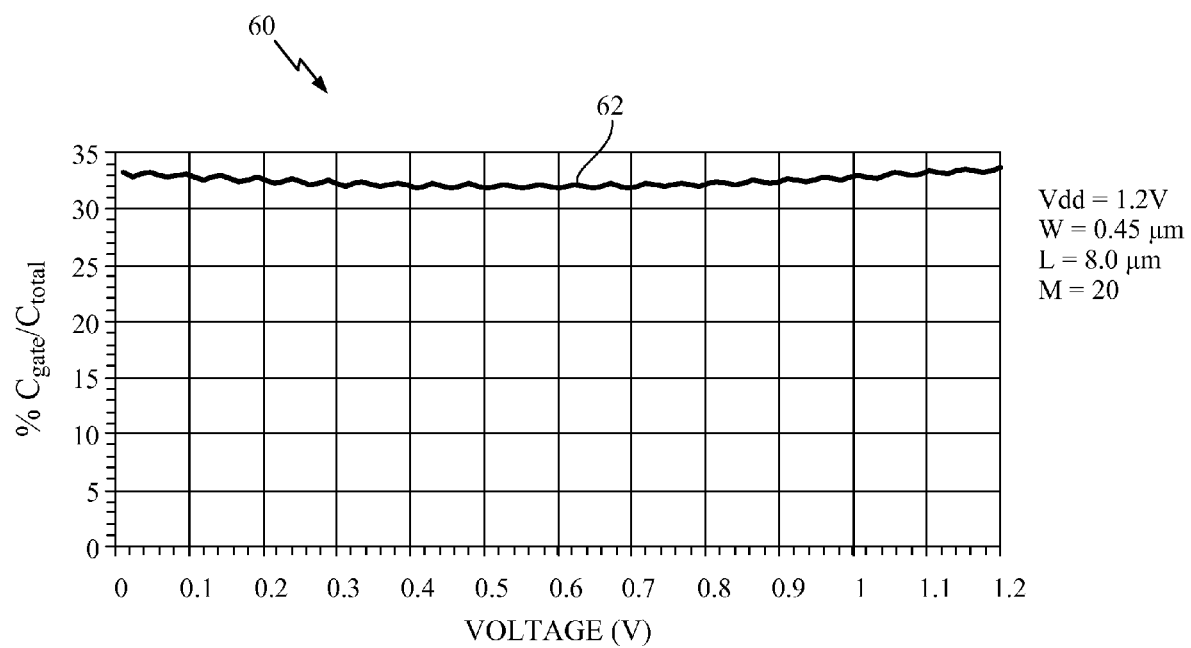
FIG. 5 is a graph of an exemplary comparison of gate to cathode overlap capacitance of FIG. 3 of a gated diode as a percentage of total capacitance of the gated diode.

It was discovered in certain modeling that approximately one-third of the total parasitic capacitance of the gated diode 32 came from the gate overlap capacitance. This is illustrated by example in the modeling graph 60 of FIG. 5. Therein, the percentage of input gate overlap component of capacitance to the total input capacitance of the pad input 16 of FIG. 1 using two complimentary gated diodes wherein the capacitance is referenced to signal grounds 12 and 10. The gated diode 32 whose anode is coupled to a second voltage rail or ground and a complementary P+/N-well diode whose cathode is coupled to $V_{dd}$ (1.2V) gated is plotted on line 62 versus voltage (V). As previously discussed, the gate capacitance is the capacitance caused as a result of the presence of the gate electrode 52. The gate electrode 52 may cause a perimeter parasitic capacitance across the insulating layer 56 between other materials of the gated diode 32, including the LDD implants 42, 46 and the other regions. As shown, the percentage of gate capacitance as a percentage of total capacitance of the gated diode 32 ranges between approximately thirty-two percent (32%) and thirty-four percent (34%) over the input voltage (V) range.

Figure 6:
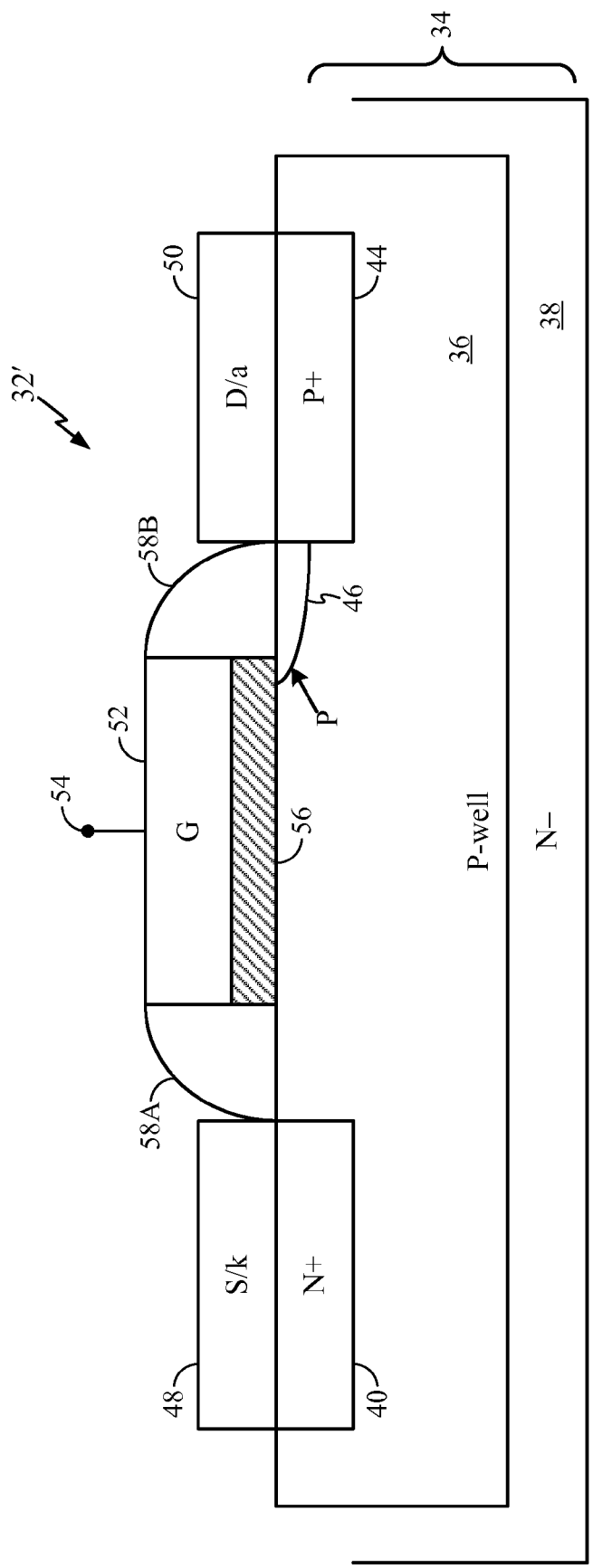
FIG. 6 is an exemplary gated diode blocking an N-type LDD implant to reduce the capacitance of the N+ P-well gated diode.

In embodiments disclosed herein, the parasitic capacitance of a gated diode is reduced by blocking either an N-type LDD implant, a P-type LDD implant, or both from a gated diode mask. Blocking means that the LDD implant is left out of the formation of the gated diode 32. This is illustrated by example in FIG. 6. Therein, an exemplary gated diode 32' is shown. The gated diode 32' is provided in a semiconductor package that is integrated into a semiconductor die and which can be mounted in a printed circuit board (PCB). The gated diode 32' has the same characteristics of the gated diode 32 of FIG. 3, except that the N-type LDD implant 42 is blocked in the gated diode 32' in FIG. 6. Blocking of the N-type LDD implant 42 reduces parasitic capacitance that would have been formed between the side wall of the N-type LDD implant 42 and the P-well semiconducting material 36 (shown as "C $N_{LDD}$-P-well" in FIG. 3), because the N-type LDD implant 42 is no longer present. Also, the strong gate electrode 52 overlap of the N-type LDD implant 42 capacitance is eliminated. For example, the total parasitic capacitance of the gated diode 32' in FIG. 6 may be between 0.6 fF/μm of Stripe Length and 1.2 fF/μm of Stripe Length. A small fringe parasitic capacitance will still be present between the gate electrode 52 and the N+ doped region 40, but it will be much lower due to the increased distance between the N+ doped region 40 and the gate electrode 52.

Blocking the N-type LDD implant 42 will not adversely affect the gated diode 32' as it would a MOSFET, as previously described above, because of the issues of hot electrons and drain induced barrier lowering present in MOSFETs. These issues do not affect the gated diode 32', because there is no surface conduction. Blocking of the N-type LDD implant 42 will also not adversely impact the turn-on time or conductance of the gated diode 32'. Further, the failure current level of the gated diode 32' may be higher when the N-type LDD implant 42 is blocked thus increasing the current shunting performance of ESD protection circuits employing the gated diode 32'. This is because the failure current level of the gated diode 32' is in part dependent on heating effects. Heating effects have a greater effect on the gated diode 32' if an LDD implant is provided due to the lower temperature at which the intrinsic carrier concentration exceeds the doping level of the LDD. The heavier doped N+ region has a higher doping level and, therefore, a higher intrinsic temperature than the LDD region. Above the intrinsic temperature, the temperature coefficient goes from negative to a large positive value causing runaway heating.

Figure 7:
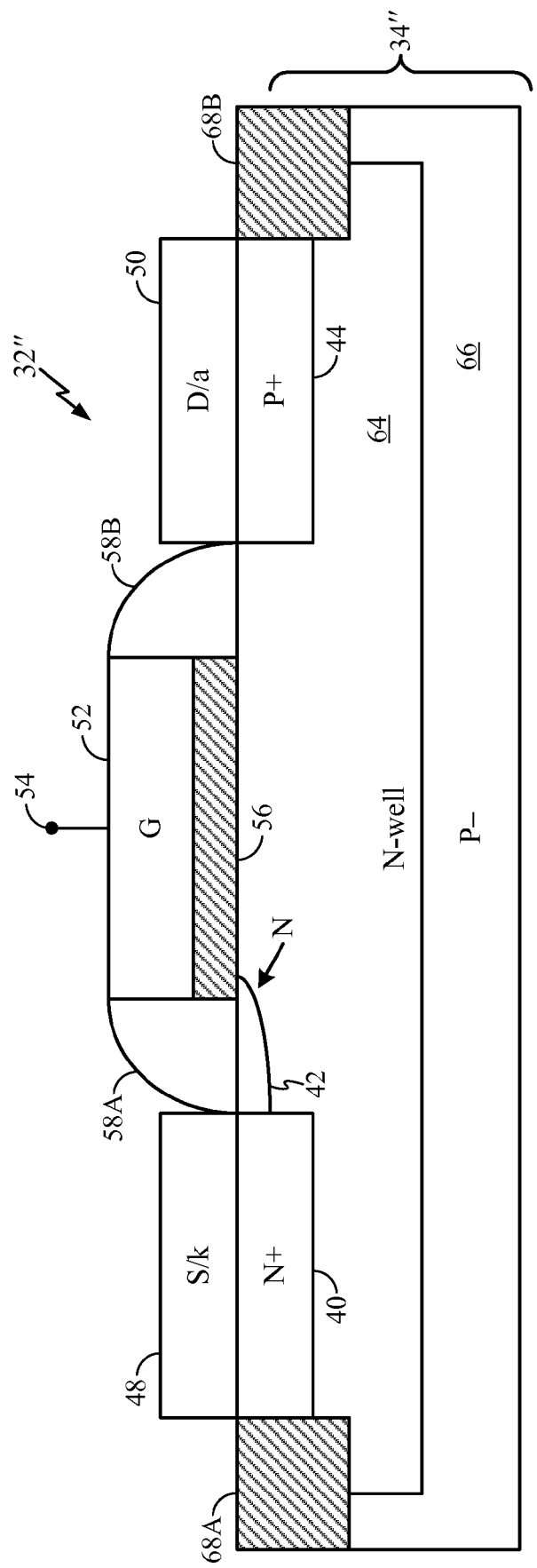
FIG. 7 is an alternative exemplary embodiment of a gated diode blocking a P-type LDD implant to reduce the capacitance of the P+ N-well gated diode.

FIG. 7 illustrates an example of a complimentary P-type gated diode 32" having a reduced parasitic capacitance by blocking of a P-type LDD implant. In this example, the P-type LDD implant 46 in the gated diode 32 of FIG. 3 is blocked as opposed to the N-type LDD implant 42. This is illustrated in the gated diode 32" of FIG. 7. In this example, a semiconductor substrate 34" is provided in the form of an N-well semiconducting material 64 formed in a P-type substrate 66 to form a P-type gated diode. A P-N junction is formed between the N-well semiconducting material 64 and P+ doped region 44. This is opposed to the N-type gated diode 32' in FIG. 6. Filled-in shallow trench isolation (STI) trenches 68A, 68B are also included between the N+ and P+ doped regions 40, 44, the cathode and anode terminals 48, 50, respectively, and the semiconductor substrate 34". The filled-in STI trenches 68A, 68B provide isolation to prevent or reduce electrical current leakage between the cathode and anode terminals 48, 50 and the semiconductor substrate 34".

The P-type LDD implant 46 is blocked in the gated diode 32" of FIG. 7 leaving the N-type LDD implant 42 unblocked. Blocking of the P-type LDD implant 46 reduces parasitic capacitance that would have been formed between the side wall of the P-type LDD implant 46 and the N-well semiconducting material 64 had the P-type LDD implant 46 not been blocked. For example, the total parasitic capacitance of the gated diode 32" in FIG. 7 may be between 0.6 fF/μm of Stripe Length and 1.2 fF/μm of Stripe Length. Some parasitic capacitance will still be present between the gate electrode 52 and the P+ doped region 44, but it will be much lower due to the increased distance between the P+ doped region 40 and the gate electrode 52.

Again, blocking the P-type LDD implant 46 will not adversely affect the gated diode 32" as it would a MOSFET for example, as previously described above, because of the issues of hot electrons and drain induced barrier lowering (DIBL). These issues do not affect the gated diode 32", because the diode relies on bulk conduction via junction based carrier injection and not on a gate induced surface inversion layer and because DIBL does not affect leakage current. Blocking of the P-type LDD implant 46 will also not adversely impact the turn-on time or conductance of the gated diode 32". Further, the failure current level of the gated diode 32" may be higher when the P-type LDD implant 46 is blocked, thus increasing the current shunting performance of ESD protection circuits employing the gated diode 32". This is because the failure current level of the gated diode 32" is in part dependent on heating effects. Heating effects have a greater effect on the gated diode 32" if an LDD implant is provided due to the intrinsic carrier concentration provided by the addition of an LDD implant.

Figure 8:
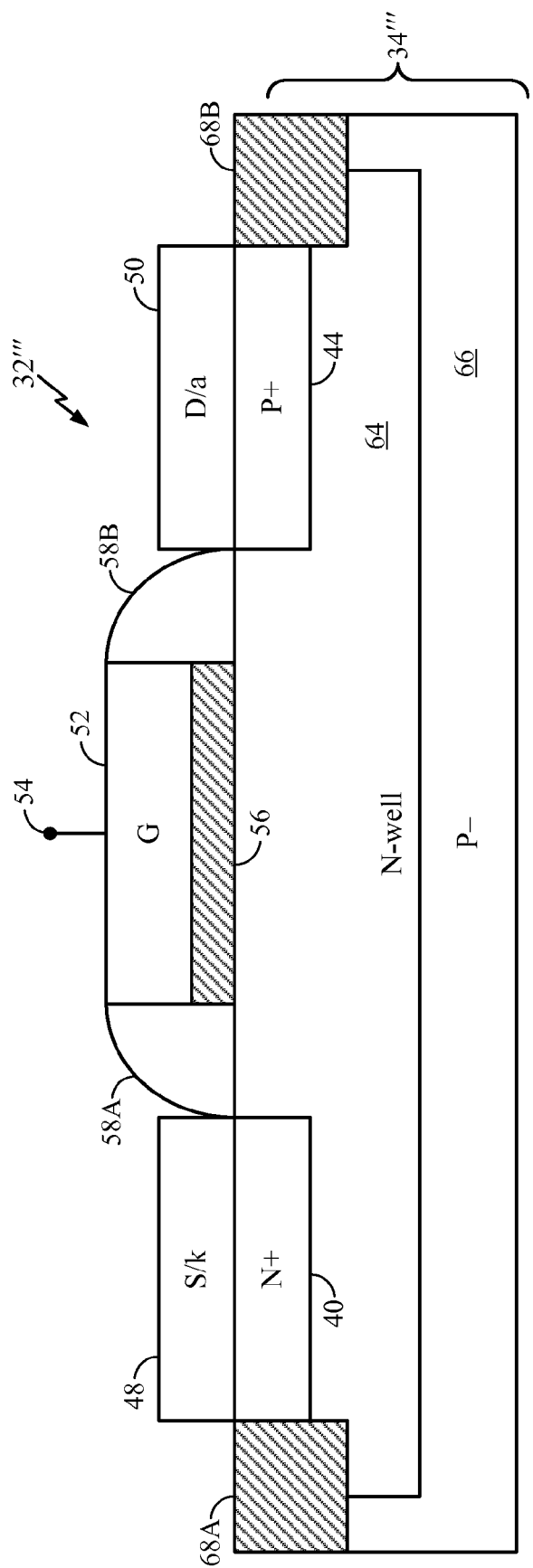
FIG. 8 is an alternative exemplary embodiment of a gated diode blocking both N-type and P-type LDD implants to reduce the capacitance of the gated diode.

Blocking the N-type LDD implant 42, as illustrated in the gated diode 32" in FIG. 7, is not necessary. However, masking of the gated diode 32" may be well facilitated if the blocking is done over the entire gated diode 32" rather than trying to divide up the masking along the middle of the gate electrode 52. In this regard, FIG. 8 illustrates yet another example of a P-type gated diode 32'''. In this example, the P-type gated diode 32''' has a reduced parasitic capacitance by blocking both N-type and P-type LDD implants. In this example, both the N-type and P-type LDD implants 42, 46 are blocked in the gated diode 32'''. This is illustrated in the gated diode 32''' in FIG. 8. In this example, a semiconductor substrate 34''' is provided in the form of the N-well semiconducting material 64 formed in the P-type substrate 66 to form a P-type gated diode, as provided in the gated diode 32" of FIG. 7. Filled-in shallow trench isolation (STI) trenches 68A, 68B are also included between the N+ and P+ doped regions 40, 44, the cathode and anode terminals 48, 50, and the semiconductor substrate 34'''. The filled-in STI trenches 68A, 68B provide isolation to prevent or reduce electrical current leakage between the cathode and anode terminals 48, 50 and the semiconductor substrate 34'''.

Both the N-type and P-type LDD implants 42, 46 are blocked in the gated diode 32''' of FIG. 8. Blocking of the N-type and P-type LDD implants 42, 46 reduces the parasitic capacitance that would have been formed between the side walls of the N-type and P-type LDD implants 42, 46 and the N-well semiconducting material 64 had the N-type and P-type LDD implants 42, 46 not been blocked. For example, the total parasitic capacitance of the gated diode 32''' in FIG. 8 may be between 0.6 fF/μm of Stripe Length and 1.2 fF/μm of Stripe Length. Some parasitic capacitance will still be present between the gate electrode 52 and the N+ and P+ doped regions 40, 44, but it will be much lower due to the increased distance between the N+ and P+ doped regions 40, 44 and the gate electrode 52. Further, blocking the N-type and P-type LDD implants 42, 46 will not adversely affect the gated diode 32''' as it would a MOSFET for example, as previously described above.

A gated diode having at least one blocked LDD implant, such as the gated diodes 32, 32', 32'' and 32''' discussed above, can be included in any circuit, integrated circuit, or circuit application. One example includes an electro-static discharge (ESD) protection circuit. The ESD protection circuit may be configured like the ESD protection circuit 18 illustrated in FIG. 1, where one or more of the conventional ESD surge diodes 20, 22 are replaced by one or more gated diodes having at least one blocked LDD implant. Employing one or more gated diodes having at least one LDD implant blocked in an ESD protection circuit enhances voltage clamping times due to the fast turn-on time of a gated diode as well as shunting excessive current as a result of the gated diode's high conductance properties. Also, the use of one or more gated diodes having at least one LDD implant blocked reduces the load capacitance of an ESD protection circuit. This may allow an ESD protection circuit to be employed to protect circuits whose performance is sensitive to load capacitance while still achieving the ESD characteristics of gated diodes. Reducing load capacitance may be important in the protected circuit operating properly, including at desired performance, speed, and/or sensitivity.

Figure 9:
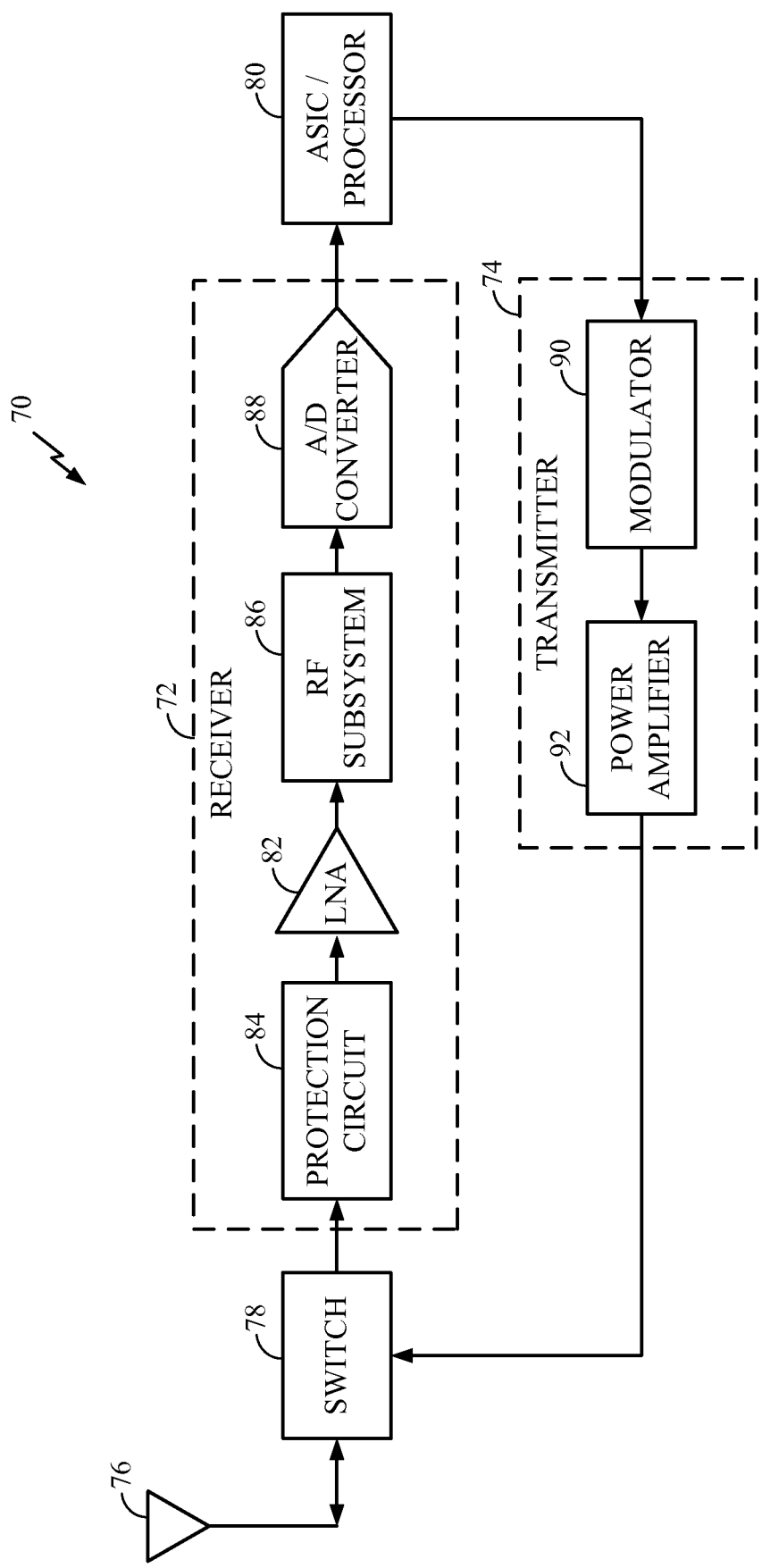
FIG. 9 is an exemplary radio frequency (RF) transceiver that includes a protection circuit having at least one gated diode blocking at least one LDD implant.

A gated diode having at least one LDD implant blocked may be used in any device or circuit, and may be used particularly for circuits whose performance may be sensitive to load capacitance. Examples of such devices and circuits include high speed differential input/output circuits and radio frequency (RF) circuits, including but not limited to low noise amplifiers (LNAs). FIG. 9 illustrates a transceiver 70 as one possible device and/or integrated circuit for providing a protection circuit employing one or more gated diodes having at least one LDD implant blocked to protect a low noise amplifier (LNA). The gated diode or diodes employed in the protection circuit may be one or more of the gated diodes 32', 32'', 32''' previously described. The transceiver 70 may be implemented in semiconductor-on-insulator (SOI) and/or SOC technology. The transceiver 70 may be employed in any device, including, as examples, a mobile telephone or terminal, personal digital assistant (PDA), wireless Local Area Network (LAN), or other similar wireless communication device(s).

As illustrated in FIG. 9, the transceiver 70 may include a receiver front end 72, a radio frequency (RF) transmitter 74, an antenna 76, a switch 78, and a processor 80. The receiver front end 72 receives information bearing radio frequency signals from one or more remote transmitters (not shown). A low noise amplifier (LNA) 82 amplifies an incoming signal received by the antenna 76. A protection circuit 84 is added to the receiver front end 72 to protect the LNA 82 and downstream circuitry from surges, including ESD surges. However, adding load capacitance to the LNA 82 could decrease its sensitivity. In this regard, the protection circuit 84 can incorporate at least one gated diode having at least one LDD implant blocked. In this manner, the added load capacitance from the protection circuit 84 is reduced while still providing the superior turn-on time and high conductance handling capability through use of a gated diode in the protection circuit 84. The gated diode or diodes employed in the ESD protection circuit 84 may be one or more of the gated diodes 32', 32'', 32''' previously described. Further, the protection circuit 84 may be an ESD protection circuit and may be configured like the ESD protection arrangement and ESD protection circuit 18 illustrated in FIG. 1, or any other arrangement or circuit desired. For example, a gated diode may be provided to clamp an excessive positive voltage, an excessive negative voltage, or both, to shunt excessive current generated as a result.

The amplified signal leaving the LNA 82 may be provided to an RF subsystem 86 where it then may be digitized using an analog-to-digital (A/D) converter 88. From there, the digitized signal may be provided to an asynchronous/synchronous integrated circuit (ASIC) or other processor 80 to be processed according to the application. For example, the ASIC or processor 80 can process the digitized, received signal to extract the information or data bits conveyed in the received signal. This processing may include demodulation, decoding, and error correction operations. The ASIC or processor 80 may be implemented in one or more digital signal processors (DSPs).

On the transmit side, the ASIC or processor 80 can receive digitized data generated as a result of the received signal, which it encodes for transmission. After encoding the data, the ASIC or processor 80 outputs the encoded data to the RF transmitter 74. A modulator 90 receives the data from the ASIC or processor 80 and in this embodiment, operates according to one or more modulation schemes to provide a modulated signal to power amplifier circuitry 92. The power amplifier circuitry 92 amplifies the modulated signal from the modulator 90 to a level appropriate for transmission from the antenna 76.

Figure 10:
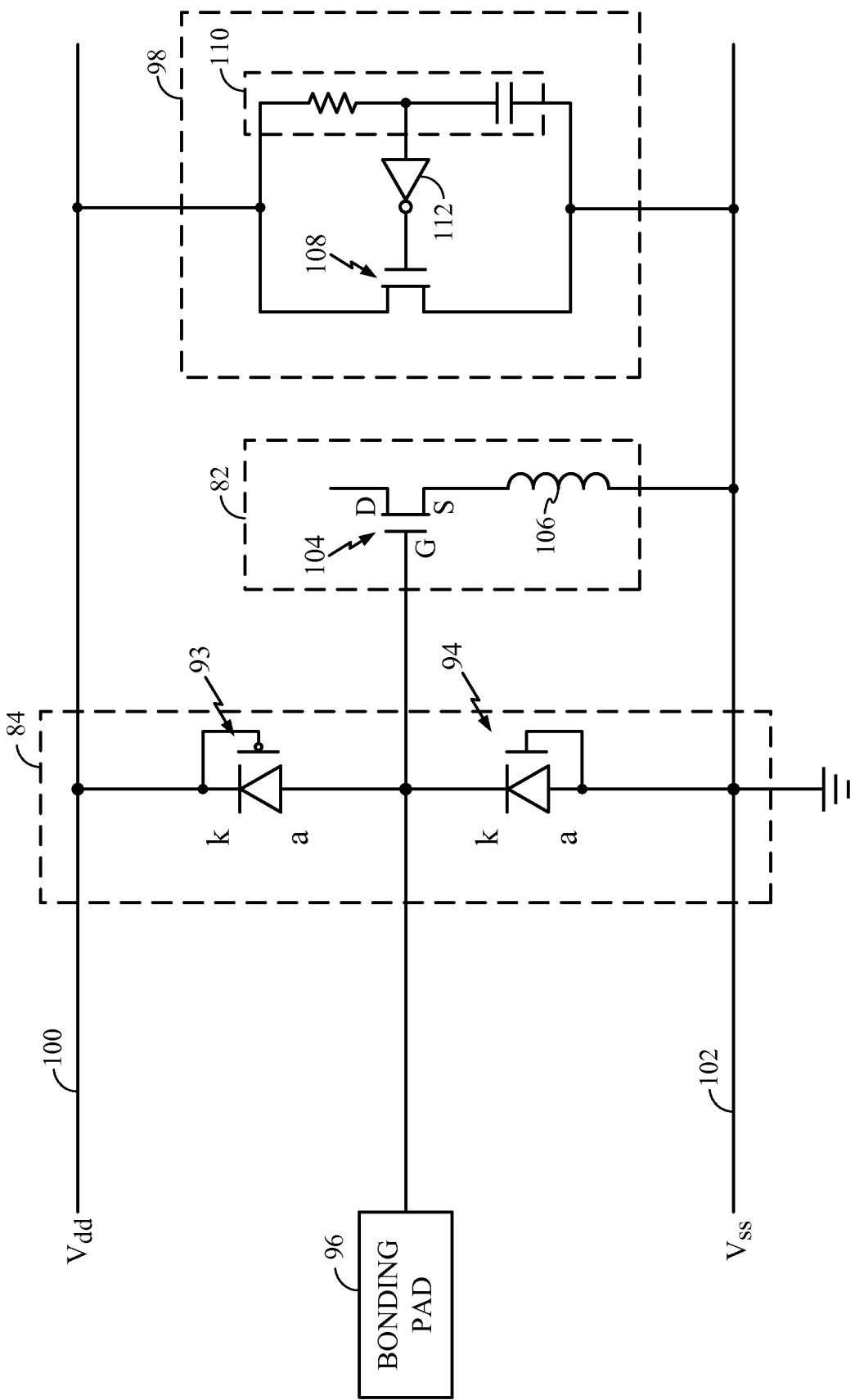
FIG. 10 is an exemplary low noise amplifier protected by an ESD protection circuit employing gated diodes having at least one LDD implant blocked.

FIG. 10 illustrates an exemplary ESD protection circuit that may be employed as the protection circuit 84 in the transceiver 70 of FIG. 9. FIG. 10 illustrates the protection circuit 84 configured to protect an input of the LNA 82. As illustrated, the protection circuit 84 includes two gated diodes 93, 94 coupled to a bonding pad 96 and a transient clamp 98 coupled to $V_{dd}$ 100 and $V_{ss}$ 102. The gated diodes 93, 94 each have at least one LDD implant blocked and may be provided according to any of the gated diodes discussed above, as examples. The protected LNA 82 includes a thin oxide amplifying N-channel field effect transistor (NFET) 104 and a source degeneration inductor 106 between the source (S) of the NFET 104 and $V_{ss}$ 102. If a positive current is injected into the bonding pad 96 with respect to $V_{ss}$ 102 during a CDM event, current will flow from the bonding pad 96 through gated diode 93 to $V_{dd}$ 100 and then from $V_{dd}$ 100 to $V_{ss}$ 102 through the transient clamp 98. The transient clamp 98 comprises an NFET 108 coupled from $V_{dd}$ 100 to $V_{ss}$ 102, a resistor capacitor (RC) transient detector or RC circuit 110, and an inverter 112 acting as a buffer between the RC transient detector 110 and the NFET 108. During a high-speed transient voltage appearing from $V_{dd}$ 100 to $V_{ss}$ 102, the RC transient detector 110 turns on the NFET 108 thereby allowing the NFET 108 to shunt a large current with a small voltage drop. During normal operation, the NFET 108 is biased off by the RC transient detector 110.

As an example, the voltage drop between the bonding pad 96 and $V_{ss}$ 102 should be low enough to keep the gate (G) to source (S) voltage across the NFET 104 below the gate oxide rupture voltage for a pulse width of 1 nanosecond (ns), which approximately corresponds to a CDM pulse width. For a 20 Å thick oxide, the gate (G) to source (S) rupture voltage of the NFET 104 is approximately 6.9V for a 1 ns pulse. The source degeneration inductor 106 has a small effect on the gate (G) to source (S) voltage drop across the NFET 104. Thus, for a positive pad to $V_{ss}$ 102 current, the gated diode 93 and the NFET 108 have a cumulative voltage drop of less than 6.9 V for CDM current amplitudes of several amps.

A gated diode or integrated circuit according to embodiments disclosed herein may be included or integrated in a semiconductor die and/or in any other device, including an electronic device. Examples of such devices include, without limitation, a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player.

Various modifications may be made to the above gated diode structures. In particular, depending on the composition of the various layers and etches used, the order in which certain layers are placed or deposited can be varied. It will also be recognized that the order of layers and the materials forming those layers in a gated diode in the above embodiments are merely exemplary. In addition, although in the illustrated embodiment the support structures are generally depicted as round or having rounded corners, in alternate embodiments the support structures may have different shapes. Moreover, in some embodiments, other layers (not shown) may be placed or deposited and processed to form portions of a gated diode device or to form other structures on the substrate. In other embodiments, these layers may be formed using alternative deposition, patterning, and etching materials and processes, may be placed or deposited in a different order, or composed of different materials, as would be known to one of skill in the art.

It is also noted that the operational tasks described in any of the exemplary embodiments herein are described to provide examples and discussion. The operations described may be performed in numerous different sequences other than the illustrated sequences. Furthermore, operations described in a single operational task may actually be performed in a number of different tasks. Additionally, one or more operational tasks discussed in the exemplary embodiments may be combined. Those of ordinary skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method comprising:
   manufacturing a gated diode to have a total parasitic capacitance less than a capacitance threshold of 1.2 femto-farad per micrometer of strip length, wherein manufacturing the gated diode includes:
   forming a well region on a semiconductor substrate, the well region having a well region impurity of either a P-doped or N-doped impurity;
   forming an insulating layer on the well region;
   forming a gate electrode on the insulating layer;
   forming a cathode region into the well region;
   forming an anode region into the well region, wherein either the cathode region or the anode region has an impurity of opposite polarity impurity from the well region impurity to form a P-N junction; and
   blocking at least one lightly-doped drain (LDD) implant from the well region.

2. The method of claim 1, wherein forming the cathode region comprises forming the cathode region into the well region on a first side of the gate electrode; and wherein forming the anode region comprises forming the anode region into the well region on a second side of the gate electrode.

3. The method of claim 1, wherein blocking at least one LDD implant comprises blocking an LDD implant from the well region between the cathode region and the insulating layer.

4. The method of claim 1, wherein blocking at least one LDD implant comprises blocking an LDD implant from the well region between the anode region and the insulating layer.

5. The method of claim 1, wherein blocking at least one LDD implant comprises blocking all LDD implants from the well region.

6. The method of claim 1, further comprising forming a shallow trench isolation (STI) region in the well region.

7. The method of claim 6, wherein forming the STI region comprises forming the STI region in the well region and in contact with either the cathode region or the anode region.

8. The method of claim 1, wherein the total parasitic capacitance is more than 0.6 femto-farad per micrometer of stripe length.

9. The method of claim 1, wherein the insulating layer has a thickness within a range of approximately 12 Angstroms and approximately 80 Angstroms.

10. An apparatus comprising:
    a gated diode having a total parasitic capacitance between approximately 0.6 femto-farad per micrometer of stripe length and approximately 1.2 fernto-farad per micrometer of stripe length, wherein the gated diode includes:
    a well region formed in a semiconductor substrate, the well region having a well region impurity of either a P-doped or N-doped impurity;
    an insulating layer on the well region;
    a gate electrode on the insulating layer;
    a cathode region implanted in the well region; and
    an anode region implanted in the well region, wherein either the cathode region or the anode region has an impurity of opposite polarity impurity from the well region impurity to form a P-N junction;
    wherein the well region has at least one lightly-doped drain (LDD) implant blocked in the well region.

11. The apparatus of claim 10, wherein the cathode region is implanted on a first side of the gate electrode, and the anode region is implanted on a second side of the gate electrode.

12. The apparatus of claim 10, further comprising a blocked LDD implant in the well region between the cathode region and the insulating layer.

13. The apparatus of claim 10, further comprising a blocked LDD implant in the well region adjacent the anode region and the insulating layer.

14. The apparatus of claim 10, further comprising:
a first spacing structure on a first side of the gate electrode in contact with the well region; and
a second spacing structure on a second side of the gate electrode in contact with the well region.

15. The apparatus of claim 10, further comprising a shallow trench isolation (STI) region in the well region in contact with either the cathode region or the anode region.

16. The apparatus of claim 10, wherein the well region impurity is a P-doped impurity, and the cathode region impurity is an N-doped impurity to form the P-N junction.

17. The apparatus of claim 10, wherein the well region impurity is an N-doped impurity, and the anode region impurity is a P-doped impurity to form the P-N junction.

18. The apparatus of claim 10, wherein the gated diode further comprises:
a source terminal coupled to the cathode region to form a cathode; and
a drain terminal coupled to the anode region to form an anode, wherein the gate electrode is directly coupled to one of the anode and the cathode.

19. The apparatus of claim 10 integrated in at least one semiconductor die.

20. The apparatus of claim 10, selected from the group consisting of a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player, into which the gated diode is integrated.

21. The apparatus of claim 10, wherein the gate electrode is coupled to a region of the gated diode having an impurity of a same polarity impurity as the well region impurity, wherein the region is one of the cathode region and the anode region.

22. The apparatus of claim 17, wherein the well region transitions directly to the cathode region having the N-doped impurity.

23. An integrated circuit comprising:
a terminal configured to convey a voltage signal to a protected circuit; and
at least one gated diode comprising an anode, a cathode, and a gate, wherein at least one lightly-doped drain (LDD) implant is blocked from the gated diode;
wherein the at least one gated diode is coupled between the terminal and a voltage rail and is configured to enter a forward conduction mode during a voltage surge event, the at least one gated diode having a total parasitic capacitance between approximately 0.6 femto-farad per micrometer of stripe length and approximately 1.2 femto-farad per micrometer of stripe length.

24. The integrated circuit of claim 23, wherein the anode is coupled to the terminal and the protected circuit, and the cathode is coupled to the voltage rail;
wherein the gated diode is configured to enter a forward conduction mode during a positive voltage surge event.

25. The integrated circuit of claim 23, further comprising:
a second gated diode comprising a second anode, a second cathode, and a second gate, wherein at least one implant is blocked from the second gated diode;
wherein the second gated diode is coupled between the terminal and a second voltage rail and is configured to enter a forward conduction mode during a negative voltage surge event.

26. The integrated circuit of claim 25, wherein the protected circuit is coupled between the terminal and the second voltage rail.

27. The integrated circuit of claim 26, further comprising a transient clamp coupled between the first voltage rail and the second voltage rail, wherein the transient clamp is configured to receive a current from the at least one gated diode and clamp the current to the second voltage rail.

28. The integrated circuit of claim 27, wherein the transient clamp includes a resistor capacitor (RC) circuit configured to activate a transistor to shunt the current to the second voltage rail.

29. The integrated circuit of claim 23, wherein the protected circuit includes a radio-frequency (RF) circuit.

30. The integrated circuit of claim 23, wherein the protected circuit includes a high speed differential input-output circuit.

31. The integrated circuit of claim 23, wherein the protected circuit includes a low noise amplifier (LNA), the LNA comprising:
an input coupled to the terminal;
a transistor coupled to the input; and
an inductive coil coupled to the transistor.

32. The integrated circuit of claim 31, wherein the protected circuit is included in a receiver and wherein an amplified signal from the LNA is provided to a radio frequency (RF) subsystem of the receiver.

33. The integrated circuit of claim 25, further comprising an electro-static discharge (ESD) protection circuit including the at least one gated diode and the second gated diode, wherein the gate of the at least one gated diode is coupled to the cathode of the at least one gated diode, and wherein the second gate of the second gated diode is coupled to the anode of the second gated diode.

34. A gated diode, comprising:
a well region formed in a semiconductor substrate, the well region having a well region impurity of either a P-doped or N-doped impurity;
an insulating layer on the well region;
a gate electrode on the insulating layer;
a cathode region implanted in the well region and having a first impurity; and
an anode region implanted in the well region and having a second impurity in opposite polarity from the first impurity of the cathode region, wherein either the first impurity or the second impurity is of opposite polarity from the well region impurity to form a P-N junction; and
means for blocking at least one lightly-doped drain (LDD) implant in the well region, wherein a first direct material transition exists between the well region and the cathode region and wherein a second direct material transition exists between the well region and the anode region; and
a total parasitic capacitance less than 1.2 femto-farad per micrometer of stripe length.

* * * * *